US010230363B2

(12) United States Patent
Gailhard et al.

(10) Patent No.: US 10,230,363 B2
(45) Date of Patent: Mar. 12, 2019

(54) ELECTRONIC SWITCHING DEVICE WITH REDUCTION OF LEAKAGE CURRENTS AND CORRESPONDING CONTROL METHOD

(71) Applicant: STMicroelectronics (Rousset) SAS, Rousset (FR)

(72) Inventors: Bruno Gailhard, Rognes (FR); Michel Cuenca, Septemes les Vallons (FR)

(73) Assignee: STMicroelectronics (Rousset) SAS, Rousset (FR)

(*) Notice: Subject to any disclaimer, the term of this patent is extended or adjusted under 35 U.S.C. 154(b) by 0 days.

(21) Appl. No.: 15/490,356

(22) Filed: Apr. 18, 2017

(65) Prior Publication Data

US 2017/0222639 A1 Aug. 3, 2017

Related U.S. Application Data

(63) Continuation of application No. 14/536,122, filed on Nov. 7, 2014, now Pat. No. 9,654,095.

(30) Foreign Application Priority Data

Nov. 25, 2013 (FR) ..................... 13 61560

(51) Int. Cl.
*H03K 17/16* (2006.01)
*H03K 17/687* (2006.01)
*H03K 3/012* (2006.01)
*G11C 27/02* (2006.01)

(52) U.S. Cl.
CPC ......... *H03K 17/161* (2013.01); *G11C 27/024* (2013.01); *H03K 3/012* (2013.01); *H03K 17/6872* (2013.01)

(58) Field of Classification Search
CPC .. H03K 17/161; H03K 17/6872; H03K 3/012; G11C 27/024
See application file for complete search history.

(56) References Cited

U.S. PATENT DOCUMENTS

| 6,265,911 | B1 | 7/2001 | Nairn |
| 7,436,221 | B2 | 10/2008 | O'Halloran et al. |
| 7,812,646 | B2 | 10/2010 | Augustyniak et al. |
| 2003/0052717 | A1 | 3/2003 | Kakitani |
| 2009/0153198 | A1 | 6/2009 | Augustyniak et al. |

FOREIGN PATENT DOCUMENTS

| DE | 102007048453 B3 | 6/2009 |
| FR | 2877513 A1 | 5/2006 |

*Primary Examiner* — Lincoln Donovan
*Assistant Examiner* — Colleen O Toole
(74) *Attorney, Agent, or Firm* — Slater Matsil, LLP

(57) ABSTRACT

A method is used to control an electronic device that includes a switching unit having a main MOS transistor having a substrate, a first conducting electrode and a second conducting electrode coupled to an output terminal. The method includes controlling the main transistor in such a way as to put it into an on state or an off state such that, when the main transistor is in the on state, the substrate and the first conducting electrode of the main transistor are connected to an input terminal and, when the main transistor is in the off state, the first conducting electrode of the main transistor is isolated from the input terminal and a first bias voltage is applied to the first conducting electrode and a second bias voltage is applied to the substrate of the main transistor.

22 Claims, 6 Drawing Sheets

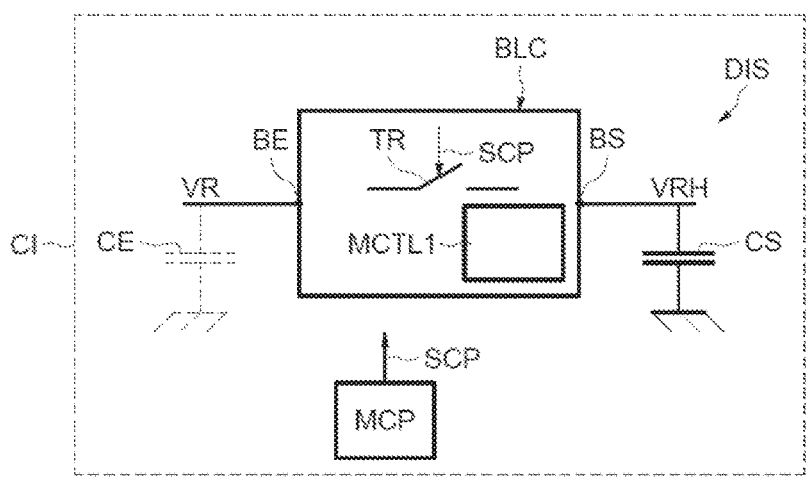
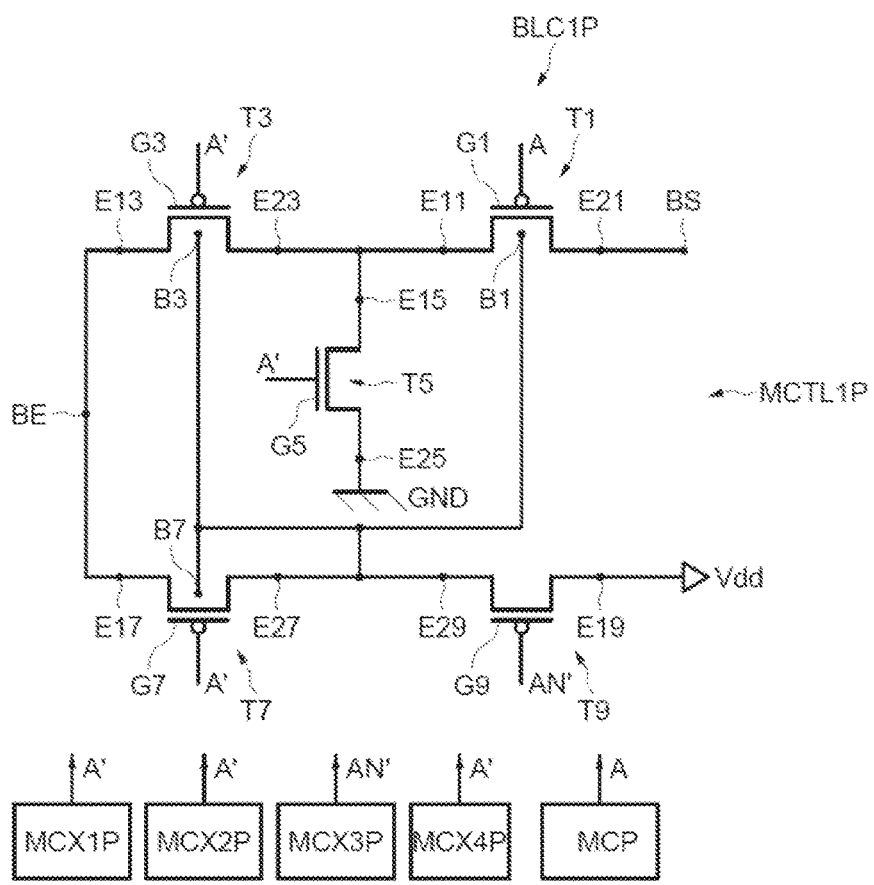

FIG.9
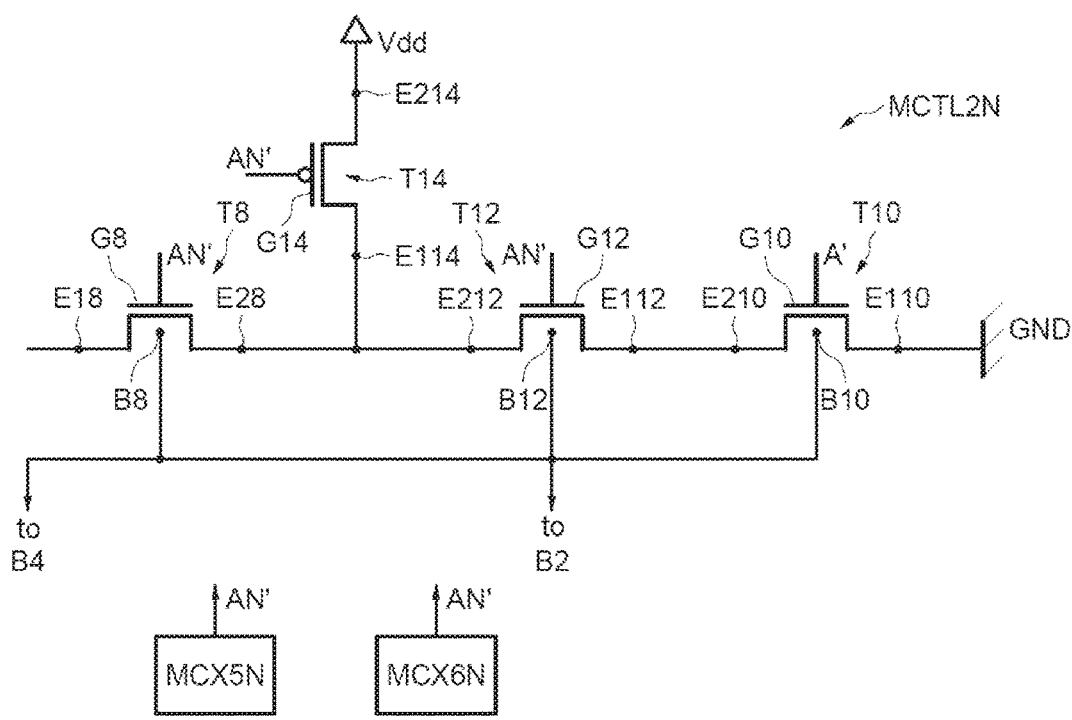
FIG.10
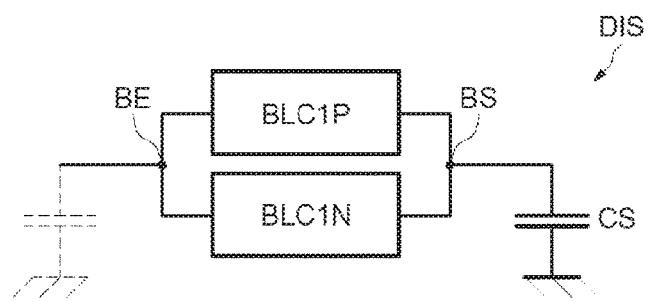
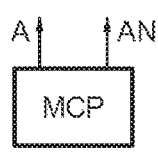

ELECTRONIC SWITCHING DEVICE WITH REDUCTION OF LEAKAGE CURRENTS AND CORRESPONDING CONTROL METHOD

This application is a continuation of U.S. patent application Ser. No. 14/536,122, filed Nov. 7, 2014, which application claims the benefit of French Application No. 1361560, filed on Nov. 25, 2013, which applications are hereby incorporated herein by reference.

TECHNICAL FIELD

Implementations and embodiments of the invention relate to the reduction of leakage currents in electronic switching devices, in particular, but not exclusively, for analog signal sample and hold applications.

BACKGROUND

In a sample and hold application, a switch receives a voltage at its input and, during a sampling period (sample), delivers that voltage to a capacitor connected to its output terminal. During the hold period (hold), the switch is open (that is to say not conducting). Because of leakage currents, the capacitor can, depending of the case, either be discharged to ground or be charged up to the power supply voltage, which therefore creates instability of the voltage present across the terminals of the capacitor.

SUMMARY

The invention advantageously, but not limitatively, applies to very low consumption devices, such as very low consumption microcontrollers that use voltage references that have to be as stable as possible. Such voltage references are generally obtained by sampling and holding an input voltage on a capacitor.

According to one implementation and embodiment, it is proposed to reduce the leakage currents of the switch as much as possible during the hold periods whilst charging the output capacitor faster during the sample periods.

According to one aspect, there is proposed a method of controlling an electronic device. This device comprises an input terminal, an output terminal and at least one switching unit comprising a main MOS transistor, for example an NMOS transistor or a PMOS transistor, having a first conducting electrode and a second conducting electrode connected to the output terminal. The method comprises a control of the main transistor in such a way as to put it into an on state or an off state.

According to a general feature of this aspect, the method furthermore comprises, when the main transistor is in its on state, a connection of its substrate and of its first conducting electrode to the input terminal. When the transistor is in its off state, its first conducting electrode is isolated from the input terminal and an application to this first conducting electrode of a first bias voltage chosen to reduce a leakage current between the two conducting electrodes of the main transistor. (This first bias voltage is able to be a zero voltage when the main transistor is a PMOS transistor or a power supply voltage when the main transistor is an NMOS transistor). In addition, a second bias voltage is applied to the substrate of the main transistor. The second bias voltage is chosen to reduce a leakage current flowing in the main transistor towards or coming from the output. (This second bias voltage is, for example, the power supply voltage when the main transistor is a PMOS transistor or a zero voltage when the main transistor is an NMOS transistor). This leakage current is the one that flows between the substrate of the main transistor and its conducting electrode connected to the output terminal.

Thus, connecting the substrate and the first conducting electrode of the main transistor to the input terminal when the latter is in its on state makes it possible to reduce the threshold voltage of that transistor and consequently its resistance in the on state (resistance RON), which make it possible to charge an output capacitor connected to the output terminal of the device faster.

Moreover, the reduction of the resistance of the main transistor in its on state makes it possible to reduce the width of the MOS transistor and therefore the size of the reverse junctions connected to the output terminal and to the source of the leakage currents flowing towards or coming from the output terminal.

Moreover, the application of the second bias voltage to the substrate of the main transistor in its off state also makes it possible to reduce the size of these reverse junctions connected to the output terminal and to the source of the leakage currents flowing towards or coming from the output terminal.

According to another aspect, an electronic device comprises an input terminal, an output terminal and a switching unit comprising a main MOS transistor. The main MOS transistor is controllable by a main control signal, having a first conducting electrode and a second conducting electrode connected to the output terminal. A main control circuit is configured to deliver the main control signal in such a way as to put the main MOS transistor into an on state or an off state.

According to a general feature of this other aspect, the switching unit comprises moreover first control circuit configured, when the main transistor is in its on state, to connect its substrate and its first conducting electrode to the input terminal and, when the main transistor is in its off state, to isolate its first conducting electrode from the input terminal and to apply onto this first conducting electrode a first bias voltage chosen to reduce a leakage current between the two conducting electrodes of the main transistor and to apply onto the substrate of the main transistor a second bias voltage chosen to reduce the flow of a leakage current towards or coming from the output terminal.

According to one embodiment, the first control circuit comprises a number of transistors and auxiliary control circuits. A first auxiliary MOS transistor, controllable by a first auxiliary control signal, is connected between the first conducting electrode of the main transistor and the input. A second auxiliary MOS transistor, controllable by a second auxiliary control signal, has a first conducting electrode connected to the input terminal and a second conducting electrode. A third auxiliary MOS transistor, controllable by a third auxiliary control signal, has a first conducting electrode configured to receive the second bias voltage and a second conducting electrode connected to the second conducting electrode of the second auxiliary transistor as well as to the substrates of the first and second auxiliary transistors. A fourth auxiliary MOS transistor, controllable by a fourth auxiliary control signal, is connected between the first conducting electrode of the main transistor and a power supply terminal intended to receive the first bias voltage.

A first auxiliary control circuit is configured to deliver the first auxiliary control signal in such a way as to put the first auxiliary transistor into an on state when the main transistor is in its on state and an off state when the main transistor is in its off state. A second auxiliary control circuit is configured to deliver the second auxiliary control signal in such a way as to put the second auxiliary transistor in an on state when the main transistor is in its on state and an off state when the main transistor is in its off state. A third auxiliary control circuit is configured to deliver the third control signal in such a way as to put the third auxiliary transistor into an off state when the main transistor is in its on state and an on state when the main transistor is in its off state. A fourth auxiliary control circuit is configured to deliver the fourth control signal in such a way as to put the fourth auxiliary transistor into an off state when the main transistor is in its on state and an on state when the main transistor is in its off state.

According to one embodiment, the main transistor and the first, second and third auxiliary transistors are MOS transistors having the same type of channel whilst the main transistor and the fourth auxiliary transistor are MOS transistors having different types of channel, and the first, second and fourth auxiliary control signals are identical and complementary with respect to the third auxiliary control signal.

In certain applications, for example in switched capacitances applications, the voltage at the input terminal can itself be a voltage present at the terminals of an input capacitor. In this case, it is preferable to also limit the leakages towards or coming from the input signal during the off periods of the switching device.

Also, according to one embodiment, the switching unit furthermore comprises second control circuit configured, when the second auxiliary transistor is in its off state, to isolate its second conducting electrode from the second conducting electrode of the third auxiliary transistor and to apply to the second conducting electrode of the second auxiliary transistor a third bias voltage chosen in order to reduce a leakage current between the two conducting electrodes of the second auxiliary transistor.

According to one embodiment, the second control circuit comprises a number of transistors and auxiliary controls circuits. A fifth auxiliary transistor, controllable by a fifth auxiliary control signal, has a first conducting electrode and its substrate connected to the second conducting electrode of the third auxiliary transistor and a second conducting electrode connected to the second conducting electrode of the second auxiliary transistor. A sixth auxiliary transistor, controllable by a sixth auxiliary control signal, is connected between the second conducting electrode of the second auxiliary transistor and a power supply terminal intended to receive the third bias voltage. A fifth auxiliary control circuit is configured to deliver the fifth auxiliary control signal in such a way as to put the fifth auxiliary transistor into an off state when the second auxiliary transistor is in its off state and an on state when the second auxiliary transistor is in its on state. A sixth auxiliary control circuit is configured to deliver the sixth auxiliary control signal in such a way as to put the sixth auxiliary transistor in an off state when the second auxiliary transistor is in its on state and an on state when the second auxiliary transistor is in its off state.

According to one embodiment, the second auxiliary transistor and the fifth auxiliary transistor are MOS transistors having the same type of channel, the second auxiliary transistor and the sixth auxiliary transistor are MOS transistors having different types of channel and the second, fifth and sixth auxiliary control signals are identical.

The first bias voltage and the third bias voltage are advantageously identical.

Moreover, in order not to interfere with the input and output signals of the device, it is preferable that each auxiliary control means is configured to deliver the corresponding auxiliary control signal in such a way that it is time-delayed with respect to the main control signal.

If the voltage present at the input terminal always remains positive and lower than the power supply voltage reduced by the threshold voltage of an NMOS transistor, then the main transistor can be an NMOS transistor and, in such an embodiment, the first bias voltage is power supply voltage and the second bias voltage is the zero voltage, for example, the ground.

If the input voltage is always included between the power supply voltage and the threshold voltage of a PMOS transistor, then the main transistor can be a PMOS transistor and, in such an embodiment, the first bias voltage is the zero voltage (for example the ground) and the second bias voltage is the power supply voltage.

If, on the other hand, the input voltage can be of any value vary between the zero voltage and the power supply voltage, it is then possible to provide for the electronic device to comprise a first switching unit containing a main PMOS transistor connected in parallel with a second switching unit comprising a main NMOS transistor, the main control circuit of the first switching unit and the main control means of the second switching unit then respectively delivering two complementary main control signals.

According to one embodiment, the device can form a sample and hold device and comprise a first capacitor connected to the output terminal and possibly a second capacitor connected to the input terminal.

According to another aspect, there is proposed an integrated circuit comprising an electronic device such as defined above.

BRIEF DESCRIPTION OF THE DRAWINGS

Other advantages and features of the invention will become apparent on examination of the detailed description of implementations and embodiments that are in no way limitative and of the appended drawings in which:

FIGS. 1 to 10 are diagrammatic illustrations of different implementations and embodiments of the invention.

DETAILED DESCRIPTION OF ILLUSTRATIVE EMBODIMENTS

Figure 3:
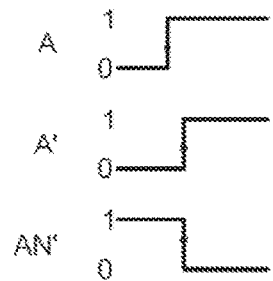

In FIG. 1, the reference DIS denotes an electronic device forming, in this non-limiting example, a sample and hold device incorporated within an integrated circuit CI.

The device comprises a switching unit BLC having an input terminal BE also forming the input terminal of the device DIS, and intended to receive an analog voltage VR, possibly delivered by a capacitor CE connected between the input terminal BE and the ground.

The switching unit BLC also comprises an output terminal BS, also forming the formant output terminal of the device, delivering a voltage VRH to the terminals of a capacitor CS connected between the output terminal BS and the ground.

The switching unit comprises a switching component TR, for example, an MOS transistor controllable on its gate by a main control signal SCP delivered by main control circuit MCP.

The transistor is thus controlled in such a way at to put it into an on state or an off state.

The switching unit BLC also comprises a first control circuit MCTL1, which will be described in greater detail below.

FIG. 2 shows in greater detail a first embodiment of a switching unit BLC1P comprising a main PMOS transistor T1 as a switching component TR.

It is therefore assumed here that the input voltage VR is included between the power supply voltage Vdd and the threshold voltage of a PMOS transistor.

This transistor T1 comprises a gate G1 intended to receive a signal A, delivered by the main control circuit MCP as a main control signal SCP.

The transistor T1 comprises a first conducting electrode E11 and a second conducting electrode E21 connected to the output terminal BS.

Those skilled in the art know that a conducting electrode of a transistor can be considered as the source or the drain depending on the type of transistor and on the bias applied to the conducting electrode. Thus, for a PMOS transistor, the conducting electrode that has the lowest potential is the drain whilst, for an NMOS transistor, the conducting electrode that has the lowest potential is the source.

The transistor T1 also has a substrate B1.

Depending on the value of the signal A, the main transistor T1 can be in an off state (if A is equal to the power supply voltage Vdd, for example) or in an on state (if A is equal to the zero voltage, which can be ground for example).

The switching unit BLC1P also comprises the first control circuit MCTL1P which is configured to, when the main transistor T1 is in its on state, connect its substrate B1 and its first conducting electrode E11 to the input terminal BE. The first control circuit MCTL1P is also configured to, when the transistor T1 is in its off state, isolate its first conducting electrode E11 from the input terminal BE and apply to that first conducting electrode a first bias voltage, in this case the ground GND, chosen to reduce the leakage current between these two conducting electrodes E11 and E21, and to apply onto the substrate B1 a second bias voltage, in this case the power supply voltage Vdd, in order to reduce the leakage current towards the output terminal BS.

More precisely, in this embodiment, the first control circuit MCTL1P comprises a first auxiliary PMOS transistor T3, controllable on its gate G3 by a first auxiliary control signal A' delivered by first auxiliary control means MCX1P. These first auxiliary control circuit MCX1P is configured to deliver the first auxiliary control signal A' in such a way at to put the first auxiliary transistor T3 into an on state when the main transistor T1 is in its on state and an off state when the main transistor T1 is in its off state.

The first auxiliary transistor T3 comprises a first conducting electrode E13 connected to the input terminal BE and a second conducting electrode E23 connected to the first conducting electrode E11 of the main transistor T1.

The first control circuit MCTL1P also comprises a second auxiliary PMOS transistor T7 controllable on its gate G7 by a second auxiliary control signal, which in this case is also the signal A', emitted by second auxiliary control circuit MCX2P. Here again, this second auxiliary control circuit is configured to put the second auxiliary transistor T7 into an on state when the main transistor T1 is in its on state and an off state when the main transistor T1 is in its off state.

The second auxiliary transistor T7 has a first conducting electrode E17 connected to the input terminal BE and a second conducting electrode E27.

The first control circuit MCTL1P also comprises a third auxiliary PMOS transistor T9, controllable on its gate G9 by a third auxiliary control signal AN' delivered by third auxiliary control circuit MCX3P. The control signal AN' is the complementary signal of the signal A'. Because of this, the third auxiliary control circuit is configured so as to put the third auxiliary transistor T9 into an off state when the main transistor T1 is in its on state and an on state when the main transistor T1 is in its off state.

The third auxiliary transistor T9 has a first conducting electrode E19 connected to the power supply voltage Vdd and a second conducting electrode E29 connected to the substrates B1, B3 and B7 of the transistors T1, T3 and T7 respectively.

Finally, the first control circuit MCTL1P comprises a fourth auxiliary NMOS transistor T5 controllable on its gate G5 by a fourth auxiliary control signal A' delivered by fourth auxiliary control circuit MCX4P. Because of this, the fourth auxiliary transistor T5 is in an off state when the main transistor T1 is in an on state and in an on state when the main transistor T1 is in its off state.

The auxiliary transistor T5 comprises a first conducting electrode E15 connected to the first conducting electrode E11 of the transistor T1 and to the second conducting electrode E23 of the transistor T3, and a second conducting electrode E25 connected to a power supply terminal, in this case the ground GND.

Even though the various control circuits MCP, MCX1P, MCX2P, MCX3P, MCX4P have been shown in FIG. 2 in a separate manner, they can in practice be embodied by a single control unit based on circuits and logic gates delivering the control signals A, A' and AN'.

Moreover, as shown in FIG. 3, it is preferable, in order not to interfere with the input and the output of the switching unit, for the auxiliary control signals A' and AN' to be time-shifted with respect to the main control signal A. In practice this can be achieved by the intermediary of time delay modules, such as inverters, for example.

In operation, when the main transistor T1 is on, the transistors T3 and T7 are on and the transistors T5 and T9 are off.

Because of this, due to the transistor T7, the substrates B1, B3 and B7 of the transistors T1, T3 and T7 are connected to the input terminal BE and therefore to the input voltage VR. Thus, the source/substrate potential difference of the transistors T3 and T1 is zero. This therefore results in an elimination of the substrate effect, a reduction of the threshold voltage of these transistors and consequently a reduction of their access resistance RON in the on state. The capacitor CS is therefore charged faster.

When the main transistor T1 is in its off state, the transistors T3 and T7 are also off. On the other hand, the transistors T5 and T9 are on.

Since the transistor T3 is off, the first conducting electrode E11 of the transistor T1 is isolated from the input terminal BE. Moreover, since the transistor T5 is on, this first conducting electrode E11 is drawn to the ground. Moreover, since the transistor T1 is off, the voltage on the gate G1 is equal to the power supply voltage Vdd. The first conducting electrode E11 of the transistor T1 is consequently its drain and the potential difference between the gate and the drain of this transistor T1 is then equal to Vdd, which puts the transistor T1 into a "super cut-off" state and minimizes the drain/source leakages of this transistor T1, that is to say the leakage current flowing between the two conducting electrodes E11 and E21.

Figure 4:
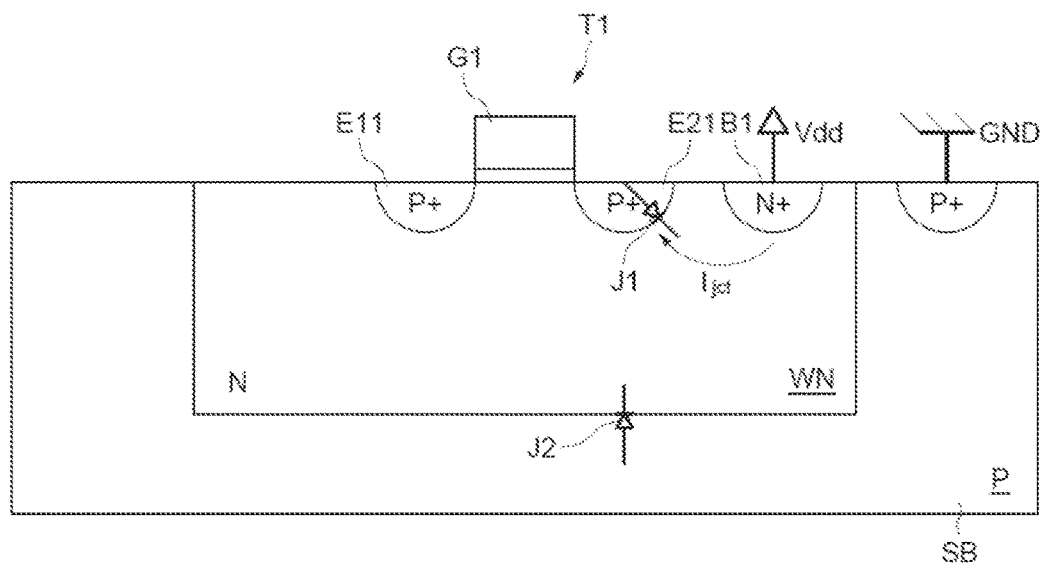

Moreover, since the transistor T9 is on, the substrates of the transistors T1, T3 and T7, and in particular the substrate B1 of the transistor T1, are taken to the power supply voltage Vdd. Because of this, as shown in FIG. 4, the only inverse PN junction connected to the output terminal BS is the junction between the P+ zone of the second conducting electrode E21 and the substrate B1. Moreover, as can be seen in FIG. 4, when the device is produced using bulk substrate technology, the substrate of the transistor T1 is semiconductor well WN with its substrate contact B1 doped N+, and this inverse junction J1 is of small size, notably in comparison with the PN junction J2 between the semiconductor well WN and the subjacent substrate SB. This junction J2, also reversed biased, has leakages but between the power supply voltage Vdd and the ground GND. However, these leakages are of such a nature as to charge the capacitor CS. Moreover, it is seen that the area of the PN junction J1 is much smaller that the area of the junction J2. The current leakages Ijct towards the output terminal BS have therefore also been reduced.

Figure 5:
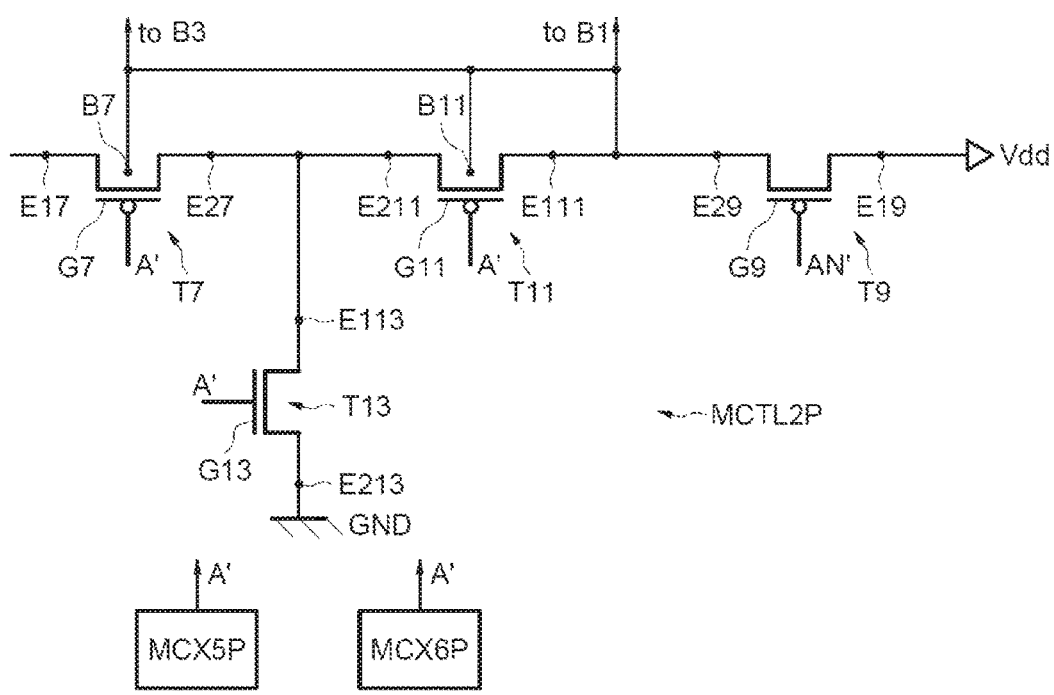

When the input voltage VR is itself a voltage resulting from a sample and hold operation of a preceding device and is present across the terminals of the input capacitor CE, it is also preferable to reduce the leakage current between the two conducting electrodes E17 and E27 of the second auxiliary transistor T7 when the latter is in its off state. That is the function of the second control means MCTL2P, an embodiment of which is shown in FIG. 5.

More precisely, these means MCTL2P are configured, when the second auxiliary transistor T7 is in an off state, to isolate its second conducting electrode E27 from the second conducting electrode E29 of the third auxiliary transistor T9 and to apply onto the second conducting electrode E27 of the second auxiliary transistor T7, a bias voltage chosen to reduce the leakage current between the two electrodes E17 and E27 of this second auxiliary transistor, this bias voltage in this case being the ground.

Moreover, in this respect, the second control means MCTL2P comprise a fifth auxiliary transistor T11, controllable on its gate G11 by a fifth auxiliary control signal which in this case is the signal A' emitted by fifth auxiliary control circuit MCX5P.

The fifth auxiliary transistor T11 has a first conducting electrode E111 and a substrate B11 connected to the second conducting electrode E29 of the third auxiliary transistor T9.

The fifth auxiliary transistor T11 also has a second conducting electrode E211 connected to the second conducting electrode E27 of the second auxiliary transistor T7.

The second control means MCTL2P also comprise a sixth auxiliary NMOS transistor T13, controllable on its gate G13 by a sixth auxiliary control signal, which in this case is the signal A', delivered by sixth auxiliary control means MCX6P. These means MCX5P and MCX6P can consequently be part of the control unit already incorporating the other auxiliary means MCX1P-MCX4P and the main control circuit MCP.

The sixth auxiliary transistor T13 has a first conducting electrode E113 connected to the second conducting electrode E27 of the transistor T7 and to the second conducting electrode E211 of the transistor T11 as well as a second conducting electrode E213 connected to the ground GND.

When the second auxiliary transistor T7 is in its off state, the auxiliary transistor T11 is also off and the transistor T9 is on. The transistor T13 is also on, consequently applying the ground GND to the second conducting electrode E27 of the transistor T7. This second electrode E27 is isolated from the second conducting electrode E29 of the transistor T9 and consequently from the power supply voltage Vdd by the transistor T11 which is off.

Since the transistor T7 is off, the voltage difference between the gate G7 of the second transistor T7 and its drain (electrode E27) is equal to Vdd, which, as explained above for the transistor T1, results in "super-cutting off" the transistor T7 and consequently in minimizing the leakage current between these two conducting electrodes E17 and E27.

Figure 6:
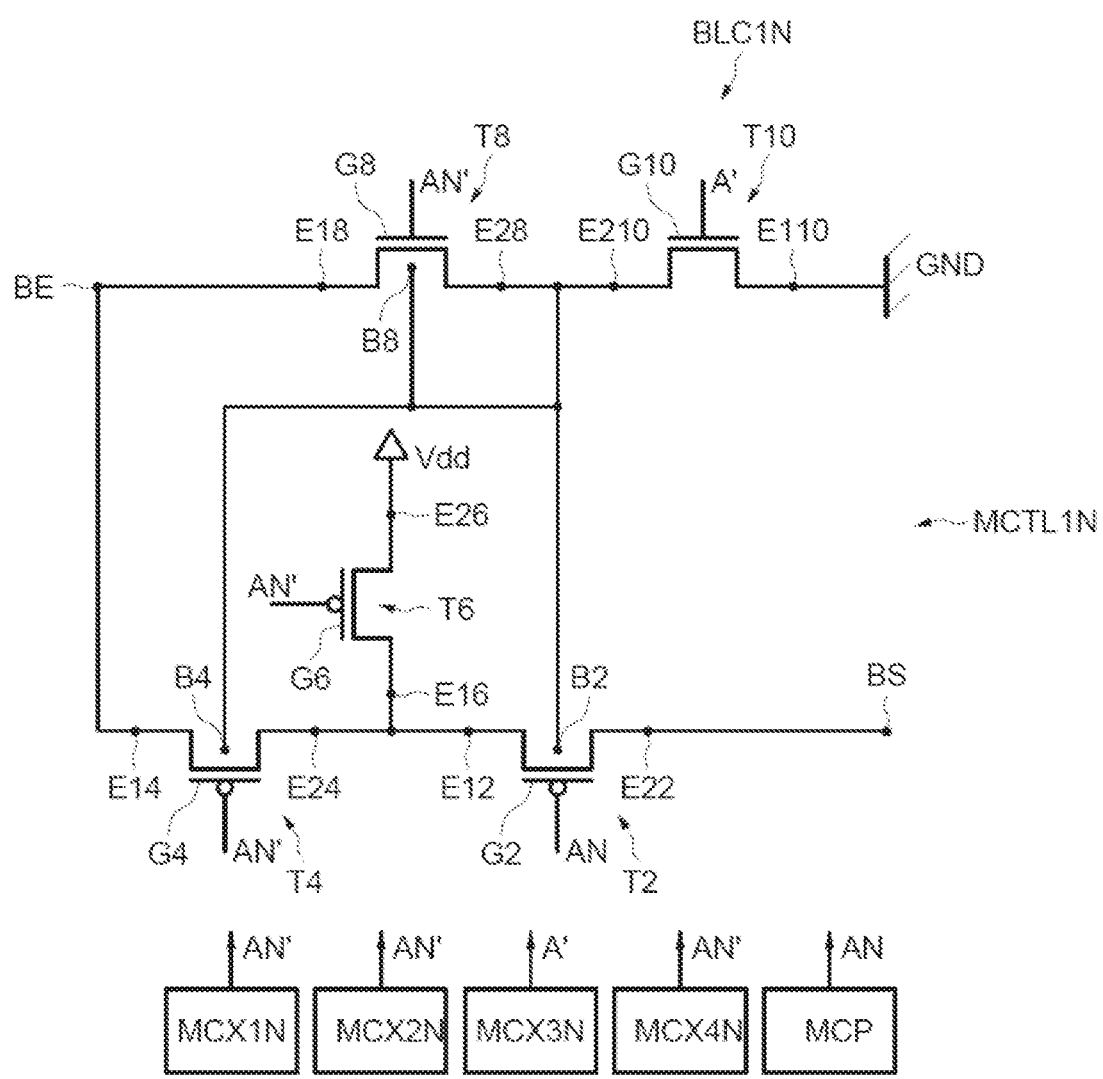

When the input voltage VR is a voltage that only varies between "0" and Vdd minus the threshold voltage of an NMOS transistor, it is then possible to use, instead of the switching unit BLC2P, the switching unit BLC2N shown in FIG. 6, which comprises the NMOS transistor T2 as its main transistor.

As can be seen in FIG. 6, the structure of the unit BLC1N is a dual structure in comparison with the structure of the unit BLC1P. The NMOS transistors T2, T4, T8, T10 are functionally similar to the PMOS transistors T1, T3, T7 and T9 of the unit BLC1P and the PMOS transistor T6 of the unit BLC1N is functionally similar to the NMOS transistor T5 of the unit BLC1P.

The main control means MCP and the auxiliary control means MCX1N-MCX4N of the unit BLC1N deliver control signals complementary to those respectively delivered by the control means MCP and MCX1P-MCX4P associated with the switching unit BLC1P.

Moreover, this time, the first conducting electrode E110 of the transistor T10 of the unit BLC1N is connected to the ground GND whilst the second conducting electrode E26 of the transistor T6 is connected to the power supply voltage Vdd.

Figure 7:
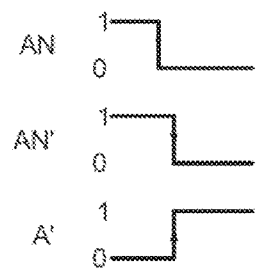

Here again, as shown in FIG. 7, it is preferable that the complementary signals AN' and A' are time-delayed with respect to the main control signal AN.

In a way that is similar to that which has been described above for the switching unit BLC1P, when the main transistor T2 of the unit BLC1N is on, its substrate B2 is connected to the input terminal BE, which makes it possible to reduce the threshold voltage and consequently the access resistance and consequently to charge the capacitor CS faster.

Moreover, when the transistor T2 is off, in a way that is similar to that described above for the unit BLC1P, the transistor T6 pulls the first electrode E12 of the transistor T2 to the power supply voltage Vdd, which results in "super-cutting off" the transistor T2 and consequently in reducing the leakage currents between the two conducting electrodes E12 and E22 of the transistor T2 to the minimum.

Figure 8:
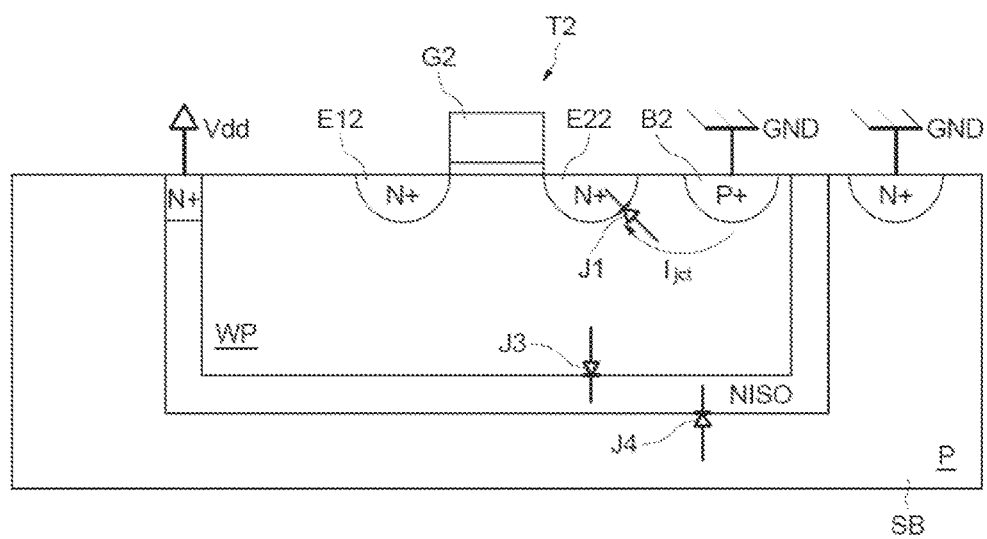

Similarly, when the transistor T2 is off, its substrate B2 is taken to the ground by the intermediary of the on transistor T10, which, as shown in FIG. 8 and by analogy with what has been described above for the unit BLC2P, limits the leakage current coming from the capacitor CS to the leakage $I_{jct}$ of the inverse junction J2 between the substrate and the conducting electrode E22 of the transistor T2. The substrate of the transistor T2 is produced by "bulk substrate" technology, the well WP having its substrate contact B2 doped P+. This well WP is isolated from the subjacent substrate SB by a layer NISO biased at Vdd. The leakages of the inverse junctions J3 and J4 are between Vdd and the ground but do not affect the output terminal BS.

Moreover, when the input terminal BE is connected to a capacitor CE, it is also preferable, as shown in FIG. 9, to provide for the switching unit BLC1N to comprise second control means MCTL2N having a dual structure and an operation that is the dual of those relating to the second control means MCTL2P in order to super-cut off the second auxiliary transistor T8 and thus to reduce the current leakages between two electrodes E18 and E28 of this transistor T8 to the minimum.

Here again, the transistors T12 and T14 correspond to the transistors T11 and T13 respectively of the second control means MCTL2P and are controlled in a complementary manner with respect to the transistors T11 and T13.

When the input voltage VR is of any value, the device DIS can then have a CMOS structure CMOS that is to say it can comprise a switching unit of the BLC1P type and a switching unit of the BLC1N type (FIG. 10) connected in parallel between the input terminal BE and the output terminal BS. The main PMOS and NMOS transistors of these switching units are then controlled in a complementary manner by the main control means MCP.

With a structure of the type of the one shown in FIG. 10, it is possible to obtain a reduction of the overall leakages of the switching device DIS by a ratio of 50 with respect to a conventional switch structure comprising a PMOS transistor connected in parallel with an NMOS transistor, the substrate of the PMOS transistor being permanently connected to the power supply voltage Vdd and the substrate of the NMOS transistor being permanently connected to the ground.

What is claimed is:

1. An electronic device, comprising:
an input terminal;
an output terminal;
a main transistor comprising a first electrode coupled to the input terminal, a second electrode coupled to the output terminal, and a substrate;
a first auxiliary transistor comprising a first electrode coupled to the first electrode of the main transistor, a second electrode coupled to the input terminal, and a substrate coupled to the substrate of the main transistor;
a second auxiliary transistor comprising a first electrode coupled to a first power supply terminal, a second electrode coupled to the input terminal, and a substrate coupled to the substrate of the main transistor and to the first electrode of the second auxiliary transistor;
a third auxiliary transistor comprising a first electrode coupled to the first power supply terminal, and a second electrode coupled to first electrode of the second auxiliary transistor;
a fourth auxiliary transistor coupled between the first electrode of the main transistor and a second power supply terminal: and
a control circuit configured to:
turn on the main transistor,
after turning on the main transistor, connect the substrate of the main transistor and the substrates of the first and second auxiliary transistors to the input terminal by turning on the second auxiliary transistor, and turning off the third auxiliary transistor,
turn off the main transistor, and
after turning off the main transistor, connect the substrate of the main transistor and the substrates of the first and second auxiliary transistors to the first power supply terminal by turning off the second auxiliary transistor, and turning on the third auxiliary transistor.

2. The electronic device of claim 1, wherein control circuit is further configured to:
when the main transistor is in an on state, turn on the first auxiliary transistor, and
turn off the fourth auxiliary transistor; and
when the main transistor is in an off state, turn off the first auxiliary transistor, and
turn on the fourth auxiliary transistor.

3. The electronic device of claim 2, wherein
the main transistor is controlled by a main signal;
the first auxiliary transistor is controlled by a first auxiliary signal;
the second auxiliary transistor is controlled by a second auxiliary signal;
the third auxiliary transistor is controlled by a third auxiliary signal; and
the fourth auxiliary transistor is controlled by a fourth auxiliary signal, wherein
the first auxiliary signal is identical to the second and fourth auxiliary signals,
the third auxiliary signal is a complementary signal of the first auxiliary signal, and
the first auxiliary signal is a delayed version of the main signal.

4. The electronic device of claim 1, wherein
the main transistor is a MOS transistor of a first MOS type;
the first auxiliary transistor is a MOS transistor of the first MOS type;
the second auxiliary transistor is a MOS transistor of the first MOS type;
the third auxiliary transistor is a MOS transistor of the first MOS type; and
the fourth auxiliary transistor is a MOS transistor of a second MOS type.

5. The electronic device of claim 4, wherein the first MOS type is an NMOS.

6. The electronic device of claim 1, wherein the main transistor is a PMOS transistor and the fourth auxiliary transistor is an NMOS transistor.

7. The electronic device of claim 1, further comprising:
a fifth auxiliary transistor comprising a first electrode coupled to the second electrode of the third auxiliary transistor, a second electrode coupled to first electrode of the second auxiliary transistor, and a substrate coupled to the substrate of the main transistor and to the first electrode of the fifth auxiliary transistor; and
a sixth auxiliary transistor coupled between the second electrode of the fifth auxiliary transistor and the second power supply terminal.

8. The electronic device of claim 7, wherein the control circuit is further configured to:
when the main transistor is in an on state,
turn on the fifth auxiliary transistor, and
turn off the sixth auxiliary transistor; and
when the main transistor is in an off state,
turn off the fifth auxiliary transistor, and
turn on the sixth auxiliary transistor.

9. The electronic device of claim 8, wherein
the main transistor is controlled by a main signal;
the first auxiliary transistor is controlled by a first auxiliary signal;
the second auxiliary transistor is controlled by a second auxiliary signal;
the third auxiliary transistor is controlled by a third auxiliary signal;
the fourth auxiliary transistor is controlled by a fourth auxiliary signal;
the fifth auxiliary transistor is controlled by a fifth auxiliary signal;
the sixth auxiliary transistor is controlled by a sixth auxiliary signal;
the first auxiliary signal is identical to the second, fourth, fifth and sixth auxiliary signals;
the third auxiliary signal is a complementary signal of the first auxiliary signal; and the first auxiliary signal is a delayed version of the main signal.

10. An electronic device, comprising:
an input terminal;
an output terminal;
a first circuit comprising:
a main MOS transistor of a first type, the main MOS transistor comprising a first electrode coupled to the input terminal, a second electrode coupled to the output terminal, and a substrate,
a first auxiliary MOS transistor of the first type, the first auxiliary MOS transistor comprising a first electrode coupled to the first electrode of the main MOS transistor of the first circuit, a second electrode coupled to the input terminal, and a substrate coupled to the substrate of the main MOS transistor of the first circuit;
a second auxiliary MOS transistor of the first type, the second auxiliary MOS transistor comprising a first electrode coupled to a first power supply terminal of the first circuit, a second electrode coupled to the input terminal, and a substrate coupled to the substrate of the main MOS transistor of the first circuit and to the first electrode of the second auxiliary MOS transistor of the first circuit;
a third auxiliary MOS transistor of the first type, the third auxiliary MOS transistor comprising a first electrode coupled to the first power supply terminal of the first circuit, and a second electrode coupled to the first electrode of the second auxiliary MOS transistor of the first circuit: and
a control circuit configured to:
turn on the main MOS transistor,
after turning on the main MOS transistor, connect the substrate of the main MOS transistor and the substrates of the first and second auxiliary MOS transistors to the input terminal by turning on the second auxiliary MOS transistor, and turning off the third auxiliary MOS transistor,
turn off the main MOS transistor, and
after turning off the main MOS transistor, connect the substrate of the main MOS transistor and the substrates of the first and second auxiliary MOS transistors to the first power supply terminal by turning off the second auxiliary MOS transistor, and turning on the third auxiliary MOS transistor.

11. The electronic device of claim 10, further comprising a second circuit, the second circuit comprising:
a main MOS transistor of a second type, the main MOS transistor comprising a first electrode coupled to the input terminal, a second electrode coupled to the output terminal, and a substrate;
a first auxiliary MOS transistor of the second type, the first auxiliary MOS transistor comprising a first electrode coupled to the first electrode of the main MOS transistor of the second circuit, a second electrode coupled to the input terminal, and a substrate coupled to the substrate of the main MOS transistor of the second circuit;
a second auxiliary MOS transistor of the second type, the second auxiliary MOS transistor comprising a first electrode coupled to a first power supply terminal of the second circuit, a second electrode coupled to the input terminal, and a substrate coupled to the substrate of the main MOS transistor of the second circuit and to the first electrode of the second auxiliary MOS transistor of the second circuit; and a third auxiliary MOS transistor of the second type, the third auxiliary MOS transistor comprising a first electrode coupled to the first power supply terminal of the second circuit, and a second electrode coupled to the first electrode of the second auxiliary MOS transistor of the second circuit.

12. The electronic device of claim 10, wherein the first circuit further comprises a fourth auxiliary MOS transistor of a second type coupled between the first electrode of the main MOS transistor of the first circuit and a second power supply terminal of the first circuit.

13. The electronic device of claim 12, further comprising a second circuit comprising:
a main MOS transistor of the second type, the main MOS transistor comprising a first electrode coupled to the input terminal, a second electrode coupled to the output terminal, and a substrate;
a first auxiliary MOS transistor of the second type, the first auxiliary MOS transistor comprising a first electrode coupled to the first electrode of the main MOS transistor of the second circuit, a second electrode coupled to the input terminal, and a substrate coupled to the substrate of the main MOS transistor of the second circuit;
a second auxiliary MOS transistor of the second type, the second auxiliary MOS transistor comprising a first electrode coupled to a first power supply terminal of the second circuit, a second electrode coupled to the input terminal, and a substrate coupled to the substrate of the main MOS transistor of the second circuit and to the first electrode of the second auxiliary MOS transistor of the second circuit;
a third auxiliary MOS transistor of the second type, the third auxiliary MOS transistor comprising a first electrode coupled to the first power supply terminal of the second circuit, and a second electrode coupled to the first electrode of the second auxiliary MOS transistor of the second circuit; and
a fourth auxiliary MOS transistor of the first type coupled between the first electrode of the main MOS transistor of the second circuit and a second power supply terminal of the second circuit.

14. The electronic device of claim 13, wherein the control circuit is further configured to:
when the main MOS transistor of the first circuit is in an on state,
turn on the first auxiliary MOS transistor of the first circuit, and
turn off the fourth auxiliary MOS transistor of the first circuit;
when the main MOS transistor of the first circuit is in an off state,
turn off the first auxiliary MOS transistor of the first circuit,
turn on the fourth auxiliary MOS transistor of the first circuit;
when the main MOS transistor of the second circuit is in an on state,
turn on the first auxiliary MOS transistor of the second circuit,
turn on the second auxiliary MOS transistor of the second circuit,
turn off the third auxiliary MOS transistor of the second circuit, and
turn off the fourth auxiliary MOS transistor of the second circuit; and when the main MOS transistor of the second circuit is in an off state,
   turn off the first auxiliary MOS transistor of the second circuit,
   turn off the second auxiliary MOS transistor of the second circuit,
   turn on the third auxiliary MOS transistor of the second circuit, and
   turn on the fourth auxiliary MOS transistor of the second circuit.

15. The electronic device of claim 14, wherein
the main MOS transistor of the first circuit is controlled by a main signal of the first circuit;
the first auxiliary MOS transistor of the first circuit is controlled by a first auxiliary signal of the first circuit;
the second auxiliary MOS transistor of the first circuit is controlled by a second auxiliary signal of the first circuit;
the third auxiliary MOS transistor of the first circuit is controlled by a third auxiliary signal of the first circuit;
the fourth auxiliary MOS transistor of the first circuit is controlled by a fourth auxiliary signal of the first circuit;
the main MOS transistor of the second circuit is controlled by a main signal of the second circuit;
the first auxiliary MOS transistor of the second circuit is controlled by a first auxiliary signal of the second circuit;
the second auxiliary MOS transistor of the second circuit is controlled by a second auxiliary signal of the second circuit;
the third auxiliary MOS transistor of the second circuit is controlled by a third auxiliary signal of the second circuit;
the fourth auxiliary MOS transistor of the second circuit is controlled by a fourth auxiliary signal of the second circuit;
the first auxiliary signal of the first circuit is identical to the second and fourth auxiliary signals of the first circuit;
the third auxiliary signal of the first circuit a complementary signal of the first auxiliary signal of the first circuit;
the first auxiliary signal of the first circuit is a delayed version of the main signal of the first circuit;
the first auxiliary signal of the second circuit is identical to the second and fourth auxiliary signals of the second circuit;
the third auxiliary signal of the second circuit a complementary signal of the first auxiliary signal of the second circuit;
the first auxiliary signal of the second circuit is a delayed version of the main signal of the second circuit; and
the main signal of the second circuit is a complementary signal of the main signal of the first circuit.

16. The electronic device of claim 13, wherein the first circuit further comprises:
   a fifth auxiliary MOS transistor of the first type, the fifth auxiliary MOS transistor comprising a first electrode coupled to the second electrode of the third auxiliary MOS transistor of the first circuit, a second electrode coupled to the first electrode of the second auxiliary MOS transistor of the first circuit, and a substrate coupled to the substrate of the main MOS transistor of the first circuit and to the first electrode of the fifth auxiliary MOS transistor of the first circuit, and
   a sixth auxiliary MOS transistor of a second type, the sixth auxiliary MOS transistor coupled between the second electrode of the fifth auxiliary MOS transistor of the first circuit and the second power supply terminal of the first circuit; and
wherein the second circuit further comprises
   a fifth auxiliary MOS transistor of the second type, the fifth auxiliary MOS transistor comprising a first electrode coupled to the second electrode of the third auxiliary MOS transistor of the second circuit, a second electrode coupled to the first electrode of the second auxiliary MOS transistor of the second circuit, and a substrate coupled to the substrate of the main MOS transistor of the second circuit and to the first electrode of the fifth auxiliary MOS transistor of the second circuit, and
   a sixth auxiliary MOS transistor of the first type, the sixth auxiliary MOS transistor coupled between the second electrode of the fifth auxiliary MOS transistor of the second circuit and the second power supply terminal of the second circuit.

17. The electronic device of claim 16, further comprising a control circuit configured to:
   when the main MOS transistor of the first circuit is in an on state,
      turn on the first auxiliary MOS transistor of the first circuit,
      turn off the fourth auxiliary MOS transistor of the first circuit,
      turn on the fifth auxiliary MOS transistor of the first circuit, and
      turn off the sixth auxiliary MOS transistor of the first circuit;
   when the main MOS transistor of the first circuit is in an off state,
      turn off the first auxiliary MOS transistor of the first circuit,
      turn on the fourth auxiliary MOS transistor of the first circuit,
      turn off the fifth auxiliary MOS transistor of the first circuit, and
      turn on the sixth auxiliary MOS transistor of the first circuit;
   when the main MOS transistor of the second circuit is in an on state,
      turn on the first auxiliary MOS transistor of the second circuit,
      turn on the second auxiliary MOS transistor of the second circuit,
      turn off the third auxiliary MOS transistor of the second circuit,
      turn off the fourth auxiliary MOS transistor of the second circuit,
      turn on the fifth auxiliary MOS transistor of the second circuit, and
      turn off the sixth auxiliary MOS transistor of the second circuit; and
   when the main MOS transistor of the second circuit is in an off state,
      turn off the first auxiliary MOS transistor of the second circuit,
      turn off the second auxiliary MOS transistor of the second circuit,
      turn on the third auxiliary MOS transistor of the second circuit,
      turn on the fourth auxiliary MOS transistor of the second circuit,
      turn off the fifth auxiliary MOS transistor of the second circuit, and turn on the sixth auxiliary MOS transistor of the second circuit.

18. The electronic device of claim 17, wherein
the main MOS transistor of the first circuit is controlled by a main signal of the first circuit;
the first auxiliary MOS transistor of the first circuit is controlled by a first auxiliary signal of the first circuit;
the second auxiliary MOS transistor of the first circuit is controlled by a second auxiliary signal of the first circuit;
the third auxiliary MOS transistor of the first circuit is controlled by a third auxiliary signal of the first circuit;
the fourth auxiliary MOS transistor of the first circuit is controlled by a fourth auxiliary signal of the first circuit;
the fifth auxiliary MOS transistor of the first circuit is controlled by a fifth auxiliary signal of the first circuit;
the sixth auxiliary MOS transistor of the first circuit is controlled by a fourth auxiliary signal of the first circuit;
the main MOS transistor of the second circuit is controlled by a main signal of the second circuit;
the first auxiliary MOS transistor of the second circuit is controlled by a first auxiliary signal of the second circuit;
the second auxiliary MOS transistor of the second circuit is controlled by a second auxiliary signal of the second circuit;
the third auxiliary MOS transistor of the second circuit is controlled by a third auxiliary signal of the second circuit;
the fourth auxiliary MOS transistor of the second circuit is controlled by a fourth auxiliary signal of the second circuit;
the fifth auxiliary MOS transistor of the second circuit is controlled by a fifth auxiliary signal of the second circuit;
the sixth auxiliary MOS transistor of the second circuit is controlled by a sixth auxiliary signal of the second circuit;
the first auxiliary signal of the first circuit is identical to the second, fourth, fifth and sixth auxiliary signals of the first circuit;
the third auxiliary signal of the first circuit a complementary signal of the first auxiliary signal of the first circuit;
the first auxiliary signal of the first circuit is a delayed version of the main signal of the first circuit;
the first auxiliary signal of the second circuit is identical to the second, fourth, fifth and sixth auxiliary signals of the second circuit;
the third auxiliary signal of the second circuit a complementary signal of the first auxiliary signal of the second circuit;
the first auxiliary signal of the second circuit is a delayed version of the main signal of the second circuit; and
the main signal of the second circuit is a complementary signal of the main signal of the first circuit.

19. A method of controlling an electronic device that comprises:
an input terminal;
an output terminal;
a main transistor having a first electrode coupled to the input terminal, a second electrode coupled to the output terminal, and a substrate;
a first auxiliary transistor having a first electrode coupled to the first electrode of the main transistor, a second electrode coupled to the input terminal, and a substrate coupled to the substrate of the main transistor;
a second auxiliary transistor having a first electrode coupled to a first power supply terminal, a second electrode coupled to the input terminal, and a substrate coupled to the substrate of the main transistor and to the first electrode of the second auxiliary transistor;
a third auxiliary transistor having a first electrode coupled to the first power supply terminal, and a second electrode coupled to first electrode of the second auxiliary transistor;
a fourth auxiliary transistor coupled between the first electrode of the main transistor and a second power supply terminal;
a fifth auxiliary transistor comprising a first electrode coupled to the second electrode of the third auxiliary transistor, a second electrode coupled to first electrode of the second auxiliary transistor, and a substrate coupled to the substrate of the main transistor and to the first electrode of the fifth auxiliary transistor; and
a sixth auxiliary transistor coupled between the second electrode of the fifth auxiliary transistor and the second power supply terminal, wherein the method comprises controlling the main transistor in such a way as to put it into an on state or an off state such that
when the main transistor is in the on state,
the substrate of the main transistor and the substrates of the of the first and second auxiliary transistors are connected to the input terminal, and
when the main transistor is in the off state,
the substrate of the main transistor and the substrates of the of the first and second auxiliary transistors are connected to the first power supply terminal, and
the first electrode of the main transistor is connected to the second power supply terminal, wherein the main transistor is turned on before the substrate of the main transistor and the substrates of the of the first and second auxiliary transistors are connected to the input terminal, and wherein the main transistor is turned off before the substrate of the main transistor and the substrates of the of the first and second auxiliary transistors are connected to the first power supply terminal, and before the first electrode of the main transistor is connected to the second power supply terminal.

20. The method of claim 19, wherein the first power supply terminal is connect to a positive voltage and the second power supply terminal is connected to ground.

21. The method of claim 19, further comprising simultaneously turning on the first and second auxiliary transistors after turning on the main transistor.

22. The method of claim 21, further comprising turning off the fourth auxiliary transistor simultaneously with turning on the first and second auxiliary transistors.

* * * * *